US011171639B2

United States Patent
Song et al.

(10) Patent No.: US 11,171,639 B2
(45) Date of Patent: Nov. 9, 2021

(54) OVERVOLTAGE PROTECTION

(71) Applicant: Infineon Technologies AG, Neubiberg (DE)

(72) Inventors: Jinsheng Song, Unterhaching (DE); Remigiusz Viktor Boguszewicz, Essen (DE)

(73) Assignee: Infineon Technologies AG

( * ) Notice: Subject to any disclaimer, the term of this patent is extended or adjusted under 35 U.S.C. 154(b) by 460 days.

(21) Appl. No.: 15/923,167

(22) Filed: Mar. 16, 2018

(65) Prior Publication Data

US 2018/0269865 A1   Sep. 20, 2018

(30) Foreign Application Priority Data

Mar. 16, 2017   (DE) .......................... 102017002573.8

(51) Int. Cl.
*H02H 3/20* (2006.01)
*H03K 17/081* (2006.01)
(Continued)

(52) U.S. Cl.
CPC .... *H03K 17/08116* (2013.01); *H01L 27/0248* (2013.01); *H01L 27/1203* (2013.01);
(Continued)

(58) Field of Classification Search
CPC ......... H03K 17/08116; H03K 17/0812; H02H 9/045; H01L 29/0649; H01L 27/0255; H01L 27/1203
(Continued)

(56) References Cited

U.S. PATENT DOCUMENTS

| 8,953,294 B2* | 2/2015 | Graf ................... H03K 17/0822 |
| | | 361/93.1 |
| 2001/0021093 A1* | 9/2001 | Sommer ................ H03K 17/18 |
| | | 361/103 |

(Continued)

FOREIGN PATENT DOCUMENTS

| DE | 10 2005 022 309 A1 | 4/2006 |
| DE | 10 2005 010 013 A1 | 9/2006 |

(Continued)

OTHER PUBLICATIONS

Chokhawala, Rahul and Saed Sobhani, (undated) "Switching Voltage Transient Protection Schemes for High Current IGBT Modules", El Segundo, CA: International Rectifier Applications Engineering, www.irf.com, 12 pgs.

(Continued)

*Primary Examiner* — Jared Fureman
*Assistant Examiner* — Lucy M Thomas
(74) *Attorney, Agent, or Firm* — Design IP

(57) ABSTRACT

A drive device adapted to drive a semiconductor power device, wherein the drive device comprises a drive circuit comprising a first terminal adapted for connection to a first terminal of the power device, a gate terminal adapted to provide a driving signal for a gate terminal of the power device, a sensor for detecting overvoltage conditions at the first terminal of the power device, and wherein the drive circuit is adapted to modify the driving signal when the sensor detects an indication of an overvoltage condition, and wherein the drive circuit including the sensor is integrated onto a single substrate.

22 Claims, 7 Drawing Sheets

(51) Int. Cl.
  *H01L 27/02* (2006.01)
  *H03K 17/082* (2006.01)
  *H01L 27/12* (2006.01)
  *H01L 29/06* (2006.01)
  *H02H 9/04* (2006.01)
  *H03K 17/0812* (2006.01)
  *H01L 29/861* (2006.01)

(52) U.S. Cl.
  CPC ......... *H01L 29/0649* (2013.01); *H02H 9/045* (2013.01); *H03K 17/0812* (2013.01); *H03K 17/0828* (2013.01); *H01L 27/0255* (2013.01); *H01L 29/861* (2013.01); *H03K 2217/0063* (2013.01)

(58) Field of Classification Search
  USPC ....................................................... 361/91.5
  See application file for complete search history.

(56) References Cited

U.S. PATENT DOCUMENTS

| | | | |
|---|---|---|---|
| 2004/0120090 A1* | 6/2004 | Galli | H02M 1/32 361/115 |
| 2006/0077000 A1 | 4/2006 | Goudo | |
| 2007/0210350 A1* | 9/2007 | Omura | H01L 29/0696 257/287 |
| 2008/0100147 A1 | 5/2008 | Yasuda et al. | |
| 2009/0206817 A1* | 8/2009 | Ng | H01L 23/48 323/303 |
| 2012/0286756 A1 | 11/2012 | Tsukiji et al. | |
| 2014/0070786 A1* | 3/2014 | Guerra | G05F 1/618 323/285 |
| 2016/0079401 A1 | 3/2016 | Zhang | |
| 2016/0311327 A1 | 10/2016 | Nakahara et al. | |

FOREIGN PATENT DOCUMENTS

| | | |
|---|---|---|
| DE | 10 2007 050 868 A1 | 5/2008 |
| DE | 10 2007 041 784 A1 | 3/2009 |
| WO | 2009 030691 A1 | 3/2009 |

OTHER PUBLICATIONS

Hong, T., Pfirsch, F., Thoben M., and Bayerer, R., (undated) "Robustness Improvement of High-Voltage IGBT by Gate Control", Warstein, Germany: Infineon Technologies, 3 pgs.

* cited by examiner

OVERVOLTAGE PROTECTION

FIELD

The present disclosure relates generally to driver circuitry for semiconductor power applications, and, in particular, to protective circuitry for driving power semiconductor devices such as IGBTs.

BACKGROUND

Semiconductor power devices are used to control currents of multiple amperes or dozens of amperes at voltages reaching into the kilovolt range. When switching, the high currents and voltages can lead to failure of the semiconductor power devices, especially in the case of switching off the power to a load.

Drivers are used to control and drive the semiconductor power switches, and also to insure that the power devices are not damaged by overcurrent and/or overvoltage conditions. The driver should control the power device so as to protect it from damage, both during normal operation and during short-circuit and other abnormal operation.

Insulated Gate Bipolar Transistors (IGBTs) are one sort of semiconductor power device which is widely used to control high-power electrical flows. Typical applications for IGBTs can be induction heating, motor drives, and electric vehicles.

An IGBT is sensitive to overvoltage conditions. Therefore, a driver for IGBTs should insure robustness of the resulting system concerning overvoltage.

SUMMARY

An example of the present disclosure suggests the integration of a maximum of functionality onto a single substrate, and in particular the integration of an overvoltage sensor for overvoltage protection on the same substrate as the driver circuitry for a semiconductor power device.

This can be achieved by integrating the sensor as an input to the driver, such that the driver receives a current input or a voltage input from the sensor as an indication of the voltage present at the collector of an IGBT device, and wherein the driver will modify the driving signal to the IGBT when the sensor detects that an overvoltage condition occurs or is at risk of occurring.

In accordance with a preferred embodiment of the present invention, a device comprises a drive circuit comprising a first terminal adapted for connection to a first terminal of the power device, a gate terminal adapted to provide a driving signal for a gate terminal of the power device, and a sensor for detecting overvoltage conditions at the first terminal of the power device, wherein the drive circuit is adapted to modify the driving signal when the sensor detects an indication of an overvoltage condition, and wherein the drive circuit including the sensor is integrated onto a single substrate.

BRIEF DESCRIPTION OF THE DRAWINGS

Further embodiments of the invention are described with the help of the figures.

DETAILED DESCRIPTION

Figure 1:
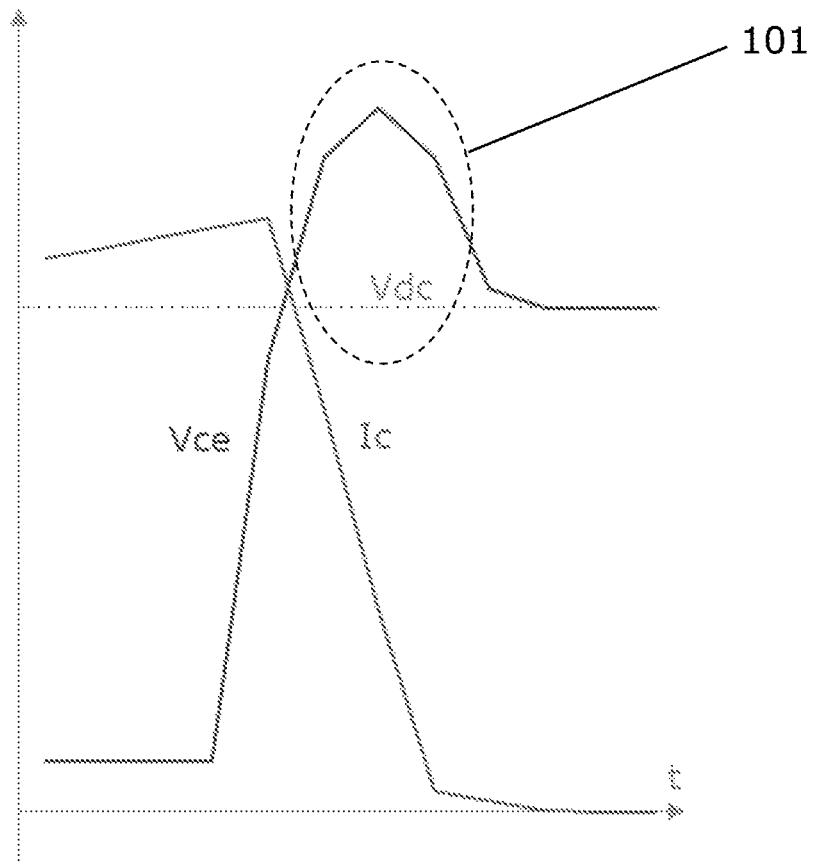
FIG. 1 shows an overvoltage spike according to one or more embodiments.

Insulated Gate Bipolar Transistors (IGBTs) are sensitive to overvoltage conditions at the collector. FIG. 1 shows the collector current Ic and the collector-emitter voltage Vce of an IGBT between collector and emitter in a use case where the IGBT is used as a power switch. The IGBT is first in an on state (Ic "high", Vce "low"), and then switches off (Ic "low", Vce "high"). During the process of switching off, an overvoltage transient appears (101) due to the parasitic inductance of the IGBT and the switching off of the current Ic. This overvoltage transient has the potential to damage IGBT devices.

An IGBT is one example of a semiconductor power device used to regulate electrical power. The term "semiconductor power device" as used in this specification intends to describe a semiconductor device on a single chip with high voltage blocking and/or high current-carrying capabilities. In other words, such power semiconductor device is configured for a high load current, typically in the Ampere range, e.g., up to several ten or hundred Ampere, and/or high voltages, typically above 5 V, or above 15 V or more typically 400V and, e.g., up to some kilo-Volts.

Protection against overvoltage may be achieved, for example, with the appropriate gate control. Active clamping is one way of introducing robustness, in that the gate voltage provided to the gate of an IGBT is controlled in such a way that the collector-emitter voltage does not reach values which would damage the IGBT.

Active clamping can be achieved using a Zener diode to measure the collector-emitter voltage Vce of the IGBT during operation. A simple solution is to connect one or more Zener diodes between collector and gate, such that when the collector is at too high a voltage relative to the gate, the Zener diodes conduct and allow current to flow to the gate, raising the gate voltage.

The Zener diode chain may be implemented using discrete devices as a Printed-Circuit Board (PCB) solution. It may be desirable to integrate this Active Clamping feature into a single driver device which can achieve similar functionality as the external solution on a PCB. However, simply integrating the Zener diode chain into a driver IC may consume dramatic silicon area, as the power dissipation caused by the high Zener breakdown current (up to several hundred mA range) is difficult to handle in an integrated driver device. Power is the product of voltage and current (P=V*I), and with the high voltages which are often used for power applications, even a small current can lead to many watts of power dissipation. For example with a 1 kV voltage drop, already 1 mA of current will generate 1 watt of heat.

The current flow through the Zener diodes must be sufficient to raise the gate voltage, which may require a physically large device to dissipate heat; the large component may also increase system cost. In addition, a resistive connection between driver and IGBT may increase the current flow through the Zener diode, if the driver continues to supply a control voltage which does not correspond to the voltage established by current through the Zener diode. Diodes other than a Zener diode cannot be used because they cannot supply sufficient current when a collector overvoltage indication requires that the gate voltage be modified.

Figure 2A:
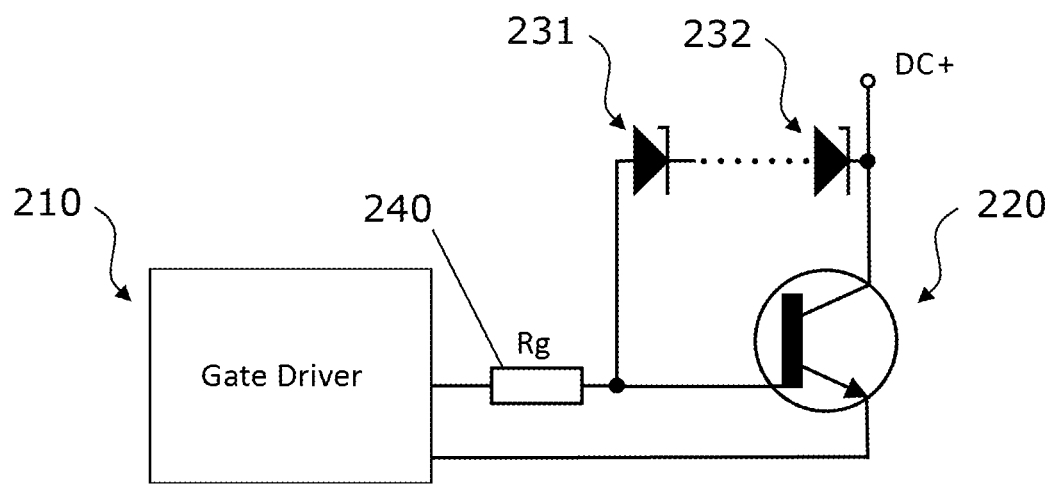
FIG. 2a shows an active clamping circuit.

A circuit to avoid transients when using semiconductor power devices in electrical power applications uses reverse-biased Zener diodes 231 and 232, as shown in FIG. 2a. These are connected between the collector and the gate of a semiconductor power device 220 such as an IGBT. There may be one Zener diode, or multiple Zener diodes in series, depending on the breakdown voltage required. There may also be a standard p-n junction diode biased in the opposite direction inserted in series with the Zener diodes, to block a reverse current flow if a voltage at the gate is higher than a voltage at the collector.

Figure 2B:
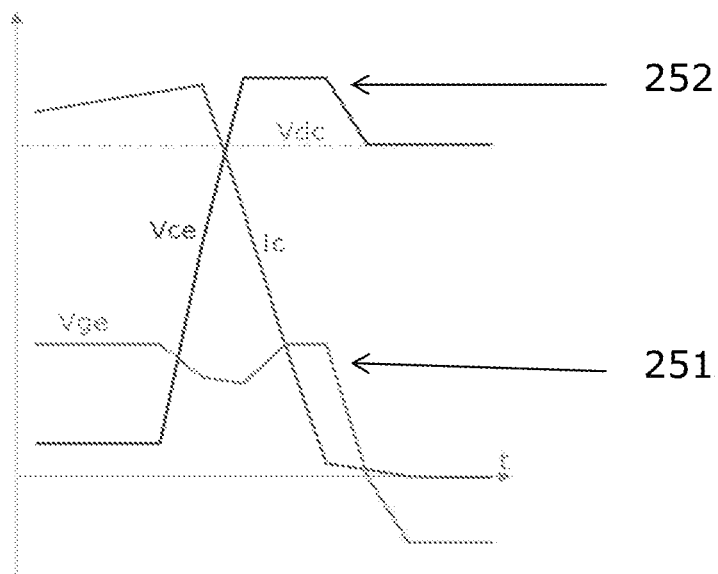
FIG. 2b shows a resulting voltage and current Vce and Ic during operation of the circuit shown in FIG. 2a during turn-off.

The operation of the circuit during turn-off is shown in FIG. 2b, in which as the gate voltage Vge declines in turning off the semiconductor power device 220, a rising Vce 252 of the power device 220 causes the Zener diodes to conduct, raising the gate voltage Vge 251 of the power device 220. The rise in gate voltage causes the power device 220 to conduct, limiting Vce 252. In this way, damage to the power device 220 can be avoided.

Circuits of the type shown in FIG. 2a are often used in conjunction with IGBTs as a semiconductor power device. Instead of the Zener diode chain as a Printed-Circuit Board (PCB) solution in FIG. 2a, often one would like to use highly integrated driver ICs which have already included needed features and functions which are required by the applications (the higher integration level, the more cost and PCB area can be saved). If the Active Clamping function can be integrated into the driver IC, it will be a value add-on for products.

One of the advantages of the instant invention is to allow the integration of an Active Clamping feature into a driver device which can achieve similar functionality as a discrete device solution on a PCB. Simply integrating the Zener diode chain into a driver IC would take substantial silicon area, and the power dissipation of the high Zener breakdown current (up to several hundred mA range) would be difficult to handle in an integrated driver device.

Figure 3:
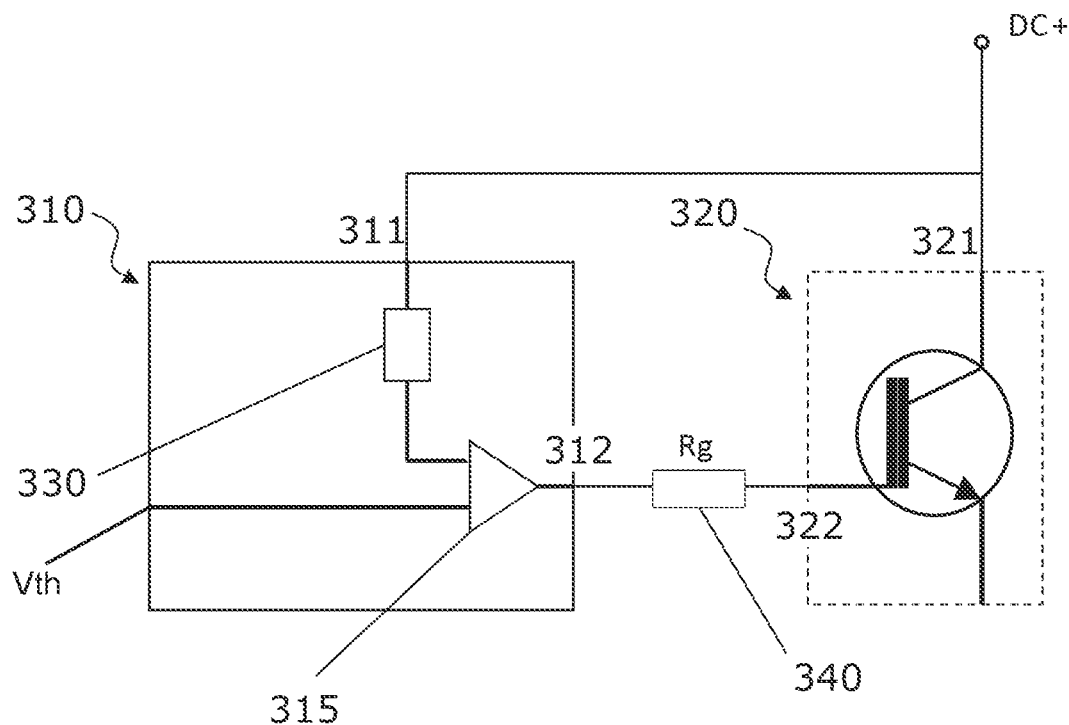
FIG. 3 shows an schematic diagram of a drive circuit according to one or more embodiments.

FIG. 3 shows an exemplary implementation of the inventive concept. Semiconductor power device 320 is controlled via gate terminal 322 coupled to the second terminal 312 of the drive device 310 comprising a drive circuit. The semiconductor power device may be an IGBT and the terminal 322 may be the gate terminal of an IGBT. The drive device is also coupled via first terminal 311 to a first terminal which is the supply terminal 321 of the power device. Supply terminal 321 may be the collector of the power device if the power device is an IGBT or the drain terminal if the power device is a MOSFET. Supply terminal 321 is coupled via first terminal 311 to the drive device and within the drive device to a sensor 330, which may be diode or resistor or capacitor. There may be no need for any other components such as resistors or other voltage dividers between the supply terminal 321 and the sensor, and in particular there may be no components between the first terminal 311 and the sensor or between supply terminal 321 and the sensor. The sensor is in turn coupled to an output generation circuit 315, which generates an output voltage at second terminal 312 of the drive device. Likewise there may be no other components such as resistors or other voltage dividers between the sensor and the output generation circuit. The coupling from terminal 312 to 322 may be direct, or may be via an optional gate resistor (Rg) 340.

The drive device 310 of FIG. 3 may be implemented as an integrated circuit with multiple transistors and other components integrated on to a single semiconductor substrate such as silicon or Silicon On Insulator (SOI). The voltage difference between the first terminal 311 and second terminal 312 of the drive device may be 100's of volts or even exceed 1 kV, which means that isolation between voltage domains on the substrate of the drive device is important. Isolation rings and SOI technology on the substrate may be needed in order to integrate all functionality onto a single substrate while keeping voltage domains separate, which is especially true when there are multiple drive circuits in a single drive device as shown below in FIG. 5. In this way, complex functionality can be achieved with less area, lower cost and higher reliability.

During operation the sensor 330 provides a signal to the output generation circuit 315 to indicate the voltage level at the supply terminal 321. This signal may be a voltage level, or it may be a current. If a voltage, the voltage will be orders of magnitude less than the voltage at first terminal 311, and if a current, the current will be orders of magnitude less than the current at the supply terminal 321, and also less than the current at second terminal 312. For example the current through the sensor 330 may be at least an order of magnitude or two orders of magnitude smaller than the current through second terminal 312. It is advantageous that the current through the sensor be limited so as not to generate excessive heat dissipation within the drive device. For example in an embodiment the sensor current may be in the range of 1 µA to 1 milli-amp, whereas gate drive current may be in the range of up to several amps.

The output generation circuit must react to an indication of overvoltage before the overvoltage is sufficient to damage the IGBT. This can be achieved, for example, by having a sensor which measures an overvoltage which is high enough to be over the normal operating voltage, but still lower than an overvoltage which will cause damage to the IGBT. The output circuit will then react to this indication of an overvoltage with enough voltage margin and time margin to protect the IGBT. Selection of the critieria used in the output generation circuit is important to make sure that the IGBT is controlled in such a way as to operate normally while within the normal voltage range yet correct for impending overvoltage conditions without damage occurring to the IGBT. For example, an operational amplifier with a fixed or a programmable threshold Vth might be used within the output generation circuit to evaluate the sensor.

The output generation circuit may evaluate a voltage signal or a current signal from the sensor in order to generate an output. The output generation circuit may transform the signal from the sensor into a digital value and generate an output based at least in part on that digital value. The output generation circuit may also maintain the signal as an analog value, and correspondingly generate an output based at least in part on the value. The output generation circuit may comprise a resistor coupled in series with the output of the sensor, and a comparator to measure voltage induced by a current through the sensor and the resistor. The voltage across the resistor may correspond primarily to a current through the sensor, or may be caused by the action of a resistive divider network or a capacitive divider network. The output generation circuit may use combinatorial logic to generate an output signal, or it may include a programmable processor to generate the output signal.

Figure 4:
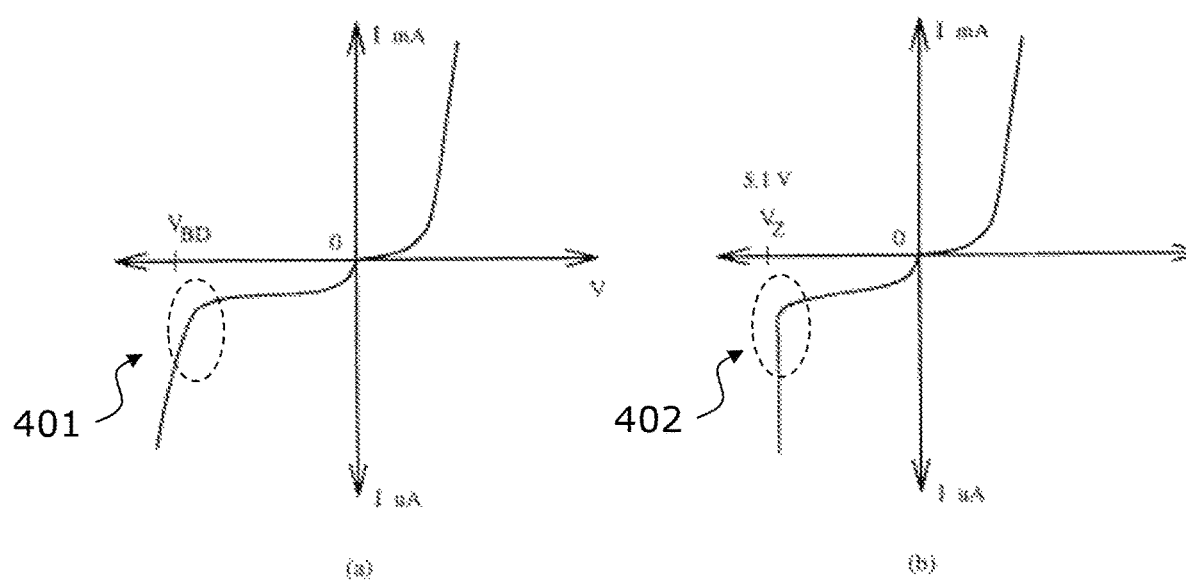
FIG. 4 shows the breakdown characteristics of a normal p-n diode and a Zener diode according to one or more embodiments.

A p-n diode may be used as a sensor 330. The p-n diode has an advantage relative to a Zener diode that during reverse conduction there is a slow rise in breakdown current, which rise can already be detected by the output generation circuit 315 to signal that the voltage at collector 321 is rising too much without a substantial current flow through the sensor 330. Increased current flow through the sensor is undesirable because it causes additional power dissipation in the drive device and in particular on the substrate where the sensor is integrated. The current profiles of a p-n diode and a Zener diode are shown in FIGS. 4a and 4b respectively, which show voltage on the x axis and current on the y axis. The output circuit can detect a rising breakdown current at 401, or a rising current at 402. The output circuit can then take action as necessary to protect the power device, such as causing the voltage at 312 or 322 to rise to increase gate voltage and thereby current flow through the power device.

If a diode is chosen as a sensor, the breakdown voltage of the diode must be selected such that the output circuit can determine an indication of an overvoltage condition before the overvoltage is enough to cause damage to the IGBT or other semiconductor power device. The diode should go into breakdown before the IGBT goes into breakdown mode. For example, an IGBT with a maximum voltage capability of 1.2 kV might be used with a diode that has a nominal breakdown voltage of less than 1.2 kV, for example 900 volts.

Figure 5:
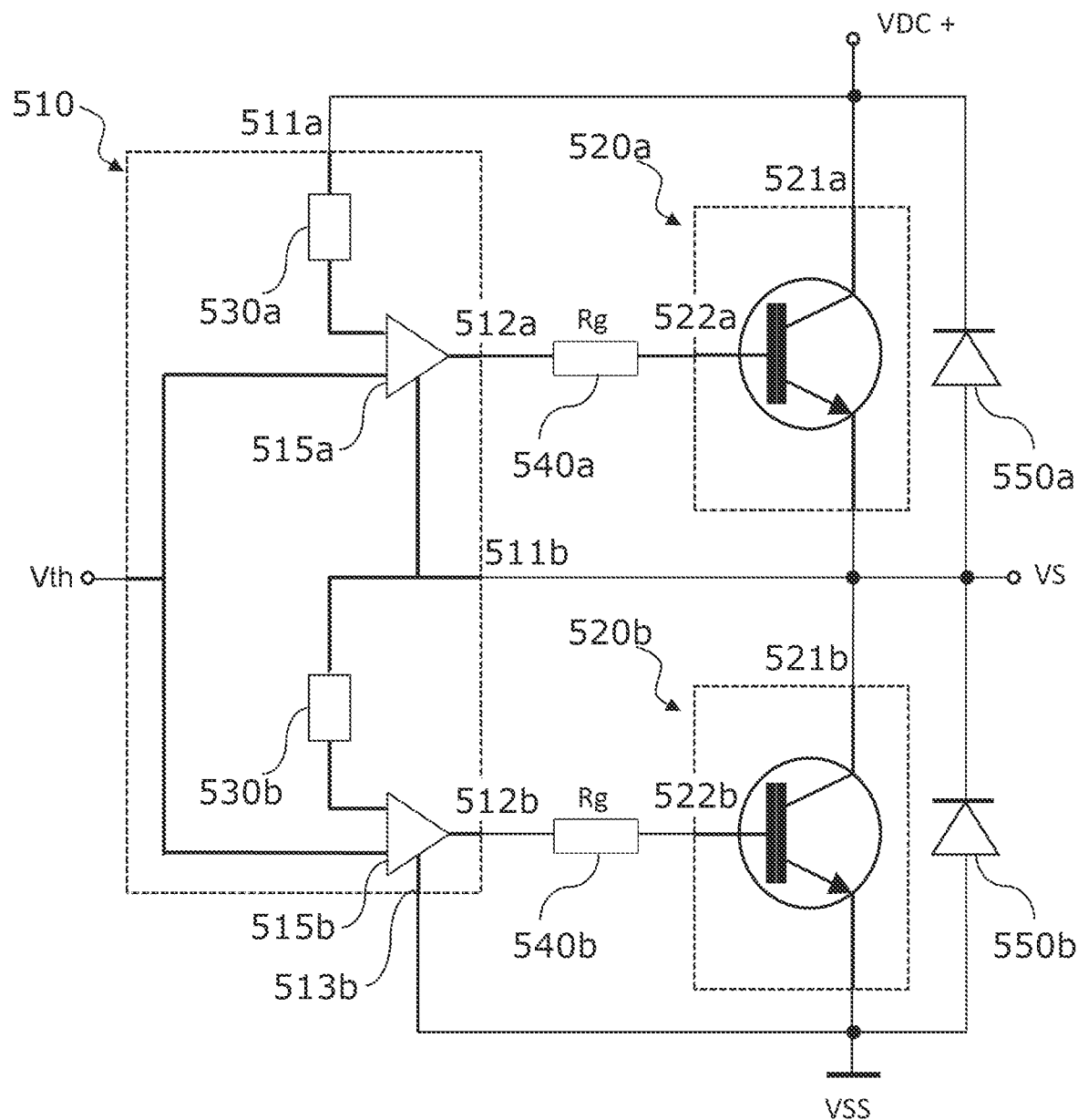
FIG. 5 shows an implementation as a half-bridge according to one or more embodiments.

If a configuration with multiple semiconductor power devices connected to one drive device is used, such as a half-bridge configuration, then there may be multiple drive circuits in a single drive device. Such an embodiment is shown in FIG. 5. The drive circuits comprise a plurality of sensors and output generation circuits.

A drive device 510 is connected to semiconductor power devices 520a and 520b. The power device 520a may be a high-side IGBT and the power device 520b may be a low-side IGBT. The respective gate terminals 522a and 522b are coupled to output generation circuits 515a and 515b, either directly or via a gate resistor 540a, 540b. The high-side and low-side sensors 530a, 530b in the respective drive circuits are connected to the respective first terminals 521a and 521b of the power devices 520a and 520b. There may be an optional connection 513b to VSS in order to establish a ground reference for the output generation circuit 515b.

The drive circuits within the drive device 510 must be appropriately insulated, as the voltage differences between the first terminals 511a, 511b and the second terminals 512a and 512b can be hundreds of volts or even greater than 1 kV.

An advantageous embodiment of the inventive concept would include all active circuitry of one or multiple drive circuits on a single substrate. In such a configuration, the sensor or sensors must be integrated on the same substrate as the output generation circuit or circuits and other circuitry as necessary. Advantageous embodiments can take advantage of substrate area used for isolation between different voltage domains, and re-use that area for the sensor or sensors as well.

A further advantageous embodiment may use a Silicon-on-Insulator (SOI) layer below the active circuitry of the drive device. SOI reduces parasitic effects in the substrate and also enables decoupling of substrate noise. For power applications, the use of an insulating layer may avoid that a forward biased p-n diode is formed between active area and e.g. a p-doped substrate. One example of an insulating layer is SiO2, or silicon dioxide. Silicon dioxide has the advantage of being easily integrated into silicon-based semiconductor manufacturing processes, and provides a high level of insulation from the substrate, which minimizes parasitic effects and decouples noise from the substrate.

Figure 6:
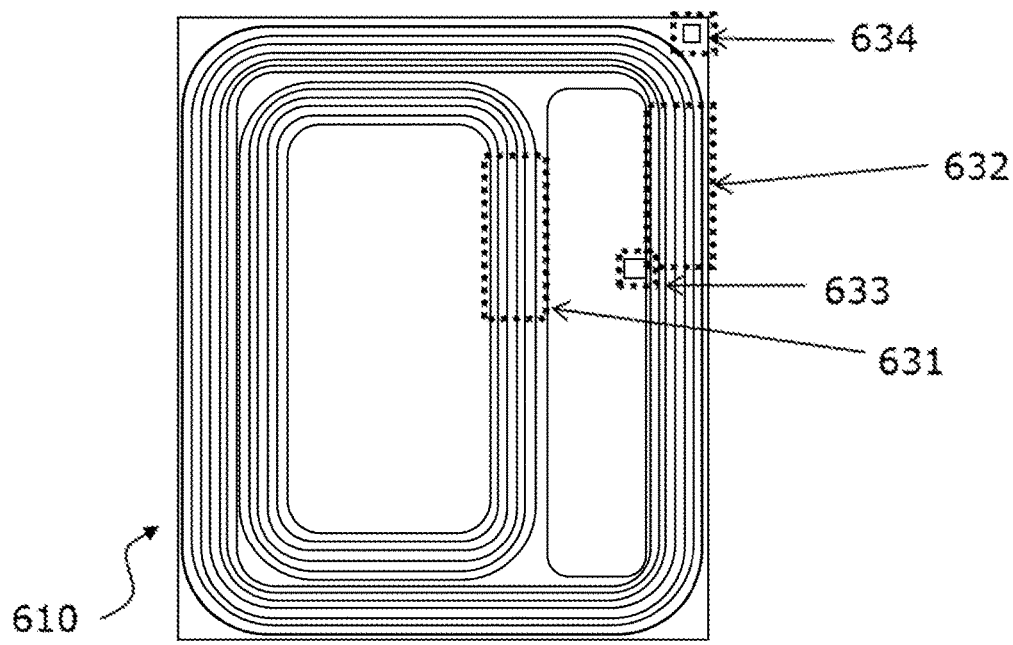
FIG. 6 shows a layout of a substrate for a half-bridge according to one or more embodiments.

FIG. 6 shows an advantageous layout of a driver IC 610 as top-down view for a half-bridge configuration, where one drive device is used to control two semiconductor power devices, which may be on separate substrates. A first sensor for the low side power device, for example a p-n diode, is advantageously located in a first junction termination ring 631. A second sensor for the high side power device, for example a p-n diode, is advantageously located in edge termination ring 632. The respective sensors may be connected to two pads for the high side 634 and for the low side 633, which can be used for further connections such as bond wires. With such a layout the added area required for the sensor can be obtained with a negligible or even no increase in the area of the substrate for the drive device.

Figure 7:
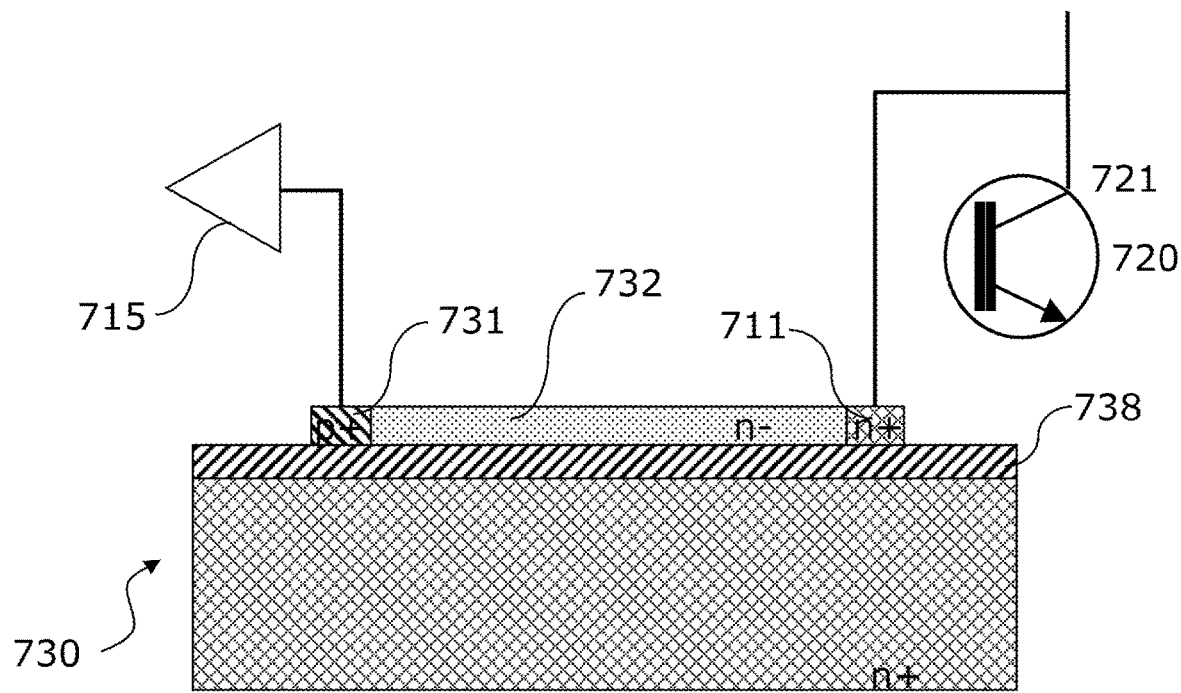
FIG. 7 shows a diode suitable for a layout according to one or more embodiments.

FIG. 7 shows a cross-section view for a sensor 730 implemented as a p-n diode, which may be located in the junction termination ring 631 or the edge termination ring 632 as shown in FIG. 6. A p+zone 731 is coupled to the output generation circuit 715. The output generation circuit 715 may include a comparator, or other circuitry as necessary to evaluate the sensor. An n– zone 732 forms a p-n junction with the p+-zone 731. Both zones are above a SiO2 insulator 738. The p-n junction forms a diode which is used to sense the voltage at the n+area 711, without requiring a high current flow which would cause heat dissipation problems in the drive device. The n+area 711 is coupled to a supply terminal 721 of a semiconductor power device 720. The first junction termination ring 631 and/or the edge termination ring 632 may each comprise a plurality of field rings or shielding region, for example p-type field rings or shielding regions arranged in an n-type substrate. The first junction termination ring 631 and/or the edge termination ring 632 may also comprise an area with a varied lateral doping concentration, for a varied p-type concentration at the surface of an n-type semiconductor body.

Figure 8A:
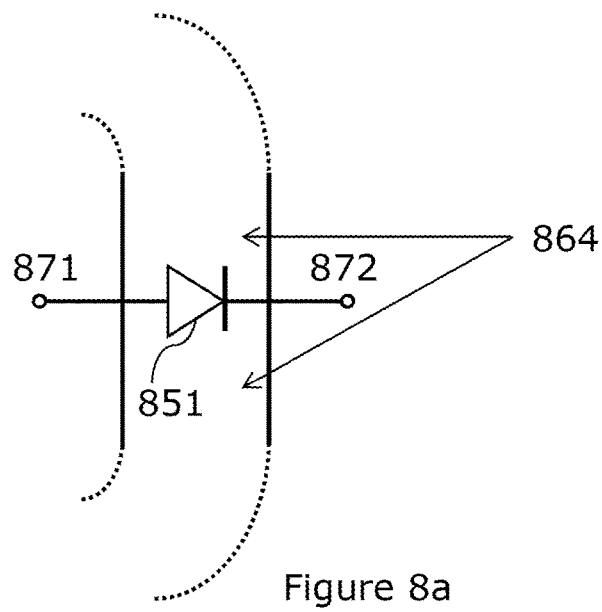
FIG. 8a shows a diode implemented as sensor according to one or more embodiments.
Figure 8B:
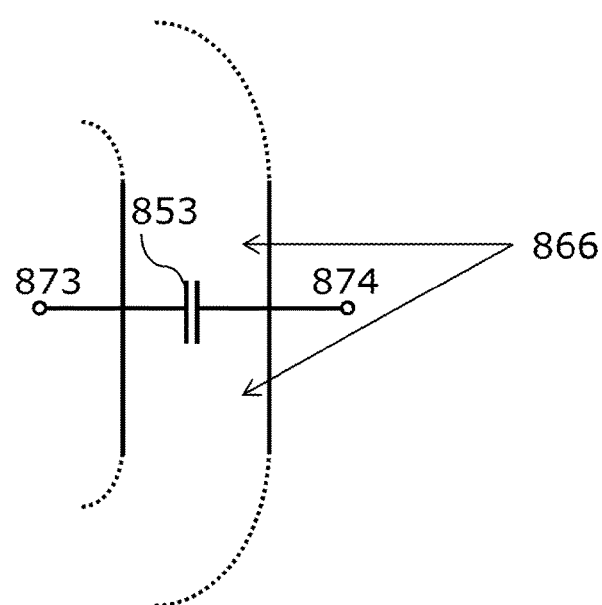
FIG. 8b shows a capacitor implemented as sensor according to one or more embodiments.
Figure 8C:
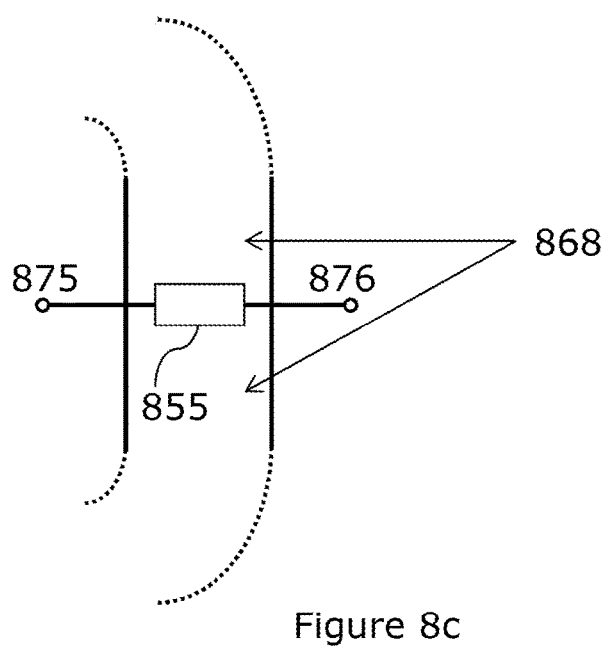
FIG. 8c shows a resistor implemented as sensor according to one or more embodiments.

FIGS. 8a, 8b, and 8c show three different possibilities for implementing the sensor. In FIG. 8a, a diode 851 is positioned in the junction termination ring 864, and is electrically between high voltage 872 and low voltage 871. In FIG. 8b, a capacitor 853 is positioned in the junction termination ring 866, and is electrically between high voltage 874 and low voltage 873. In FIG. 8c, a resistor 855 is positioned in the junction termination ring 868, and is electrically between high voltage and low voltage. In an embodiment the resistor may be high-ohmic so as not to cause heat dissipation problems. A sensor may also be composed of any combination taken from diodes, capacitors and resistors.

In the case of a resistor 855 as sensor, in one embodiment of the inventive concept the resistor may be connected in series with a further resistor to ground or other reference, such that the signal provided to the output generation circuit comes from the midpoint of a voltage divider between the first terminal and the ground or other reference. In this case the output generation circuit may not evaluate currents, but rather voltages from the sensor which give an indication of the voltage at the first terminal. Likewise in the case of a capacitor 853 as sensor, in one embodiment of the inventive concept the capacitor may be connected in series with a capacitor or a resistor to form a voltage divider.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described herein, but many rearrangements, modifications, and substitutions are possible without departing from the scope of the present disclosure.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open-ended terms that indicate the presence of stated elements or features, but do not preclude additional elements or features. The articles "a", "an" and "the" are intended to include the plural as well as the singular, unless the context clearly indicates otherwise.

While this invention has been described with reference to illustrative embodiments, this description is not intended to be construed in a limiting sense. Various modify-cations and combinations of the illustrative embodiments, as well as other embodiments of the invention, will be apparent to persons skilled in the art upon reference to the description. It is therefore intended that the appended claims encompass any such modifications or embodiments.

What is claimed is:

1. A drive device configured to drive a semiconductor power device, the drive device comprising:
   a drive integrated circuit comprising:
      a sense terminal configured to connect to a first terminal of the semiconductor power device;
      a gate control terminal configured to provide a driving signal for a gate terminal of the semiconductor power device;
      a sensor coupled to the sense terminal and configured to provide a measurement signal indicative of a voltage level at the first terminal of the semiconductor power device; and
      an output generation circuit comprising a first input terminal configured to receive the measurement signal and a second input terminal configured to receive a threshold value, the output generation circuit is configured to detect one or more overvoltage conditions at the first terminal of the semiconductor power device based on the measurement signal and the threshold value, and modify the driving signal in response to detecting an indication of an overvoltage condition at the first terminal of the semiconductor power device,
   wherein the drive integrated circuit, including the sensor and the output generation circuit, is integrated onto a single semiconductor substrate,
   wherein the sensor is integrated within the drive integrated circuit and is configured to be connected between the sense terminal and the first input terminal of the output generation circuit, and
   wherein the output generation circuit is configured to compare the measurement signal provided by the sensor to the threshold value, and modify the driving signal to increase a conduction of the semiconductor power device in direct response to the comparison indicating that the measurement signal has exceeded the threshold value,
   wherein the drive integrated circuit further comprises an isolation ring configured to be interposed between the semiconductor power device and the output generation circuit, wherein the isolation ring includes a first voltage domain boundary and a second voltage domain boundary, wherein the isolation ring forms a closed loop that encircles the output generation circuit, and wherein the sensor is integrated in the insolation ring between the first voltage domain boundary and the second voltage domain boundary.

2. The drive device according to claim 1, wherein the single semiconductor substrate comprises multiple drive integrated circuits with multiple sense terminals and multiple gate control terminals configured to connect to semiconductor power devices that are arranged in a half-bridge configuration.

3. The drive device according to claim 1, wherein the output generation circuit reacts to a current that flows from the sense terminal through the sensor for modifying the driving signal.

4. The drive device according to claim 3, wherein the sensor is integrated on an insulating layer of the isolation ring that is configured to separate a first voltage domain of the semiconductor power device and a second voltage domain of the output generation circuit.

5. The drive device according to claim 4, wherein the insulating layer is an SiO2 layer.

6. The drive device according to claim 4, wherein the drive integrated circuit is configured to be electrically isolated from the first terminal of the semiconductor power device by the isolation ring.

7. The drive device according to claim 1, wherein the semiconductor power device is an Insulated Gate Bipolar Transistor (IGBT).

8. The drive device according claim 1, wherein the sensor is composed from one or more elements comprising p-n diodes, resistors, and capacitors.

9. The drive device according to claim 1, wherein the sensor is a p-n diode.

10. The drive device according to claim 1, wherein a current through the sensor is at least an order of magnitude less than a current through the gate control terminal of the drive integrated circuit.

11. The drive device according to claim 1, wherein the sense terminal is configured to connect directly to the first terminal of the semiconductor power device.

12. The drive device according to claim 1, wherein:
    a voltage at the first input terminal of the output generation circuit is at least one order of magnitude less than a voltage at the first terminal of the semiconductor power device.

13. The drive device according to claim 1, wherein the sensor includes a p-n diode having a breakdown voltage less than a maximum voltage capability of the semiconductor power device, wherein the p-n diode allows current to pass only in the forward direction.

14. The drive device according to claim 1, wherein the sensor is a resistor, a capacitor, or a p-n diode consisting of a sensor input terminal connected to the sense terminal and a sensor output terminal connected to the first input terminal of the output generation circuit.

15. A system comprising:
a drive device coupled to at least one semiconductor power device and configured to drive a gate of each of the at least one semiconductor power device, the drive device comprising a drive integrated circuit comprising:
a sense terminal configured to connect to a first terminal of a semiconductor power device of the at least one semiconductor power device;
a gate control terminal configured to provide a driving signal for a gate terminal of the semiconductor power device;
a sensor coupled to the sense terminal and configured to provide a measurement signal indicative of a voltage level at the first terminal of the semiconductor power device; and
an output generation circuit comprising a first input terminal configured to receive the measurement signal and a second input terminal configured to receive a threshold value, the output generation circuit is configured to detect one or more overvoltage conditions at the first terminal of the semiconductor power device based on the measurement signal and the threshold value, and modify the driving signal in response to detecting an indication of an overvoltage condition at the first terminal of the semiconductor power device,
wherein the drive integrated circuit, including the sensor and the output generation circuit, is integrated onto a single semiconductor substrate,
wherein the sensor is integrated within the drive integrated circuit and is configured to be connected between the sense terminal and the first input terminal of the output generation circuit,
wherein the output generation circuit is configured to compare the measurement signal provided by the sensor to the threshold value, and modify the driving signal to increase a conduction of the semiconductor power device in direct response to the comparison indicating that the measurement signal has exceeded the threshold value, and
wherein the drive integrated circuit further comprises an isolation ring configured to be interposed between the semiconductor power device and the output generation circuit, wherein the isolation ring includes a first voltage domain boundary and a second voltage domain boundary, wherein the isolation ring forms a closed loop that encircles the output generation circuit, and wherein the sensor is integrated in the insolation ring between the first voltage domain boundary and the second voltage domain boundary.

16. The system according to claim 15, wherein the drive device comprises the single semiconductor substrate which comprises multiple drive integrated circuits with multiple sense terminals and multiple gate control terminals.

17. The system according to claim 15, wherein the drive device is connected to the semiconductor power device and another semiconductor power device that are arranged in a half-bridge configuration.

18. The system according to claim 15, wherein the semiconductor power device is an IGBT.

19. The system according to claim 15, wherein the sensor is integrated on an insulating layer of the isolation ring that is configured to separate a first voltage domain of the semiconductor power device and a second voltage domain of the output generation circuit.

20. A method according to claim 19, wherein the insulating layer is an SiO2 layer.

21. A method of operating a semiconductor power device with a drive device wherein the drive device comprises a sense terminal coupled to a first terminal and a gate control terminal coupled to a gate terminal of the semiconductor power device, the method comprising:
providing a driving signal to the gate terminal of the semiconductor power device;
providing, by a sensor, a measurement signal indicative of a voltage level at the first terminal of the semiconductor power device;
comparing, by an output generation circuit, the measurement signal provided by the sensor to a threshold value;
detecting, by the output generation circuit, an overvoltage condition at the first terminal of the semiconductor power device when the measurement signal exceeds the threshold voltage at the output generation circuit, the sensor being integrated between the sense terminal and the output generation circuit of the drive device;
modifying, by the output generation circuit, the driving signal in response to detecting the overvoltage condition, including increasing a conduction of the semiconductor power device in response to detecting the overvoltage condition; and
isolating the output generation circuit from the first terminal of the semiconductor power device with an isolation ring interposed between the first terminal of the semiconductor power device and the output generation circuit, wherein the isolation ring includes a first voltage domain boundary and a second voltage domain boundary, wherein the isolation ring forms a closed loop that encircles the output generation circuit, and wherein the sensor is integrated in the insolation ring between the first voltage domain boundary and the second voltage domain boundary.

22. The method according to claim 21, further comprising:
providing two driving signals to two semiconductor power devices arranged in a half-bridge configuration.

* * * * *